(12) United States Patent
Oue et al.

(10) Patent No.: US 11,418,674 B2
(45) Date of Patent: Aug. 16, 2022

(54) IMAGE PROCESSING APPARATUS AND NON-TRANSITORY COMPUTER READABLE MEDIUM STORING PROGRAM TO SUPPRESS DEVIATION IN SUB-SCANNING DIRECTION AT THE TIME OF IMAGE FORMATION

(71) Applicant: FUJIFILM Business Innovation Corp., Tokyo (JP)

(72) Inventors: Suguru Oue, Kanagawa (JP); Daiki Takazawa, Kanagawa (JP); Takayuki Hashimoto, Kanagawa (JP); Masaki Nudejima, Kanagawa (JP); Tomoyuki Ono, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 597 days.

(21) Appl. No.: 16/209,967

(22) Filed: Dec. 5, 2018

(65) Prior Publication Data

US 2019/0281248 A1   Sep. 12, 2019

(30) Foreign Application Priority Data

Mar. 9, 2018   (JP) .............................. JP2018-042577

(51) Int. Cl.
*H04N 1/047* (2006.01)
*H04N 5/3745* (2011.01)
(Continued)

(52) U.S. Cl.
CPC ..... *H04N 1/0473* (2013.01); *H01L 27/14605* (2013.01); *H04N 1/32358* (2013.01);
(Continued)

(58) Field of Classification Search
CPC ............. H04N 1/0473; H04N 1/32358; H04N 2201/0094; H04N 2201/04787;
(Continued)

(56) References Cited

U.S. PATENT DOCUMENTS 6,118,463 A * 9/2000 Houki .................... H04N 1/506
347/116
8,970,892 B2   3/2015 Itou
(Continued)

FOREIGN PATENT DOCUMENTS

JP   2000029782   1/2000
JP   2012168372   9/2012
(Continued)

OTHER PUBLICATIONS

"Office Action of Japan Counterpart Application", dated Dec. 7, 2021, with English translation thereof, p. 1-p. 6.

*Primary Examiner* — Chad Dickerson
(74) *Attorney, Agent, or Firm* — JCIPRNET

(57) ABSTRACT

An image processing apparatus includes a processing unit that shifts plural pieces of pixel data so as to suppress deviation in a sub-scanning direction at the time of image formation; a storage unit that stores the plural pieces of pixel data; and a converting unit that converts addresses of the plural pieces of pixel data such that a predetermined number of pieces of pixel data which are a unit of processing of the shift process are stored in a cache memory used by the storage unit at once.

8 Claims, 8 Drawing Sheets

(51) Int. Cl.
  *H01L 27/146* (2006.01)
  *H04N 5/341* (2011.01)
  *H04N 1/32* (2006.01)
(52) U.S. Cl.
  CPC ......... *H04N 5/341* (2013.01); *H04N 5/37452* (2013.01); *H04N 5/37455* (2013.01); *H04N 2201/0094* (2013.01); *H04N 2201/04787* (2013.01)
(58) Field of Classification Search
  CPC ............... H04N 5/341; H04N 5/37452; H04N 5/37455; H01L 27/14605
  USPC ...... 358/474, 505, 3.13, 1.11–1.18, 1.9, 2.1; 399/301; 347/116
  See application file for complete search history.

(56) References Cited

U.S. PATENT DOCUMENTS

| | | | |
|---|---|---|---|
| 9,195,160 B2 | 11/2015 | Morita | |
| 2014/0268253 A1* | 9/2014 | Itou | H04N 1/32358 358/474 |

FOREIGN PATENT DOCUMENTS

| | | |
|---|---|---|
| JP | 2013184458 | 9/2013 |
| JP | 2014071625 | 4/2014 |
| JP | 2014178745 | 9/2014 |

* cited by examiner

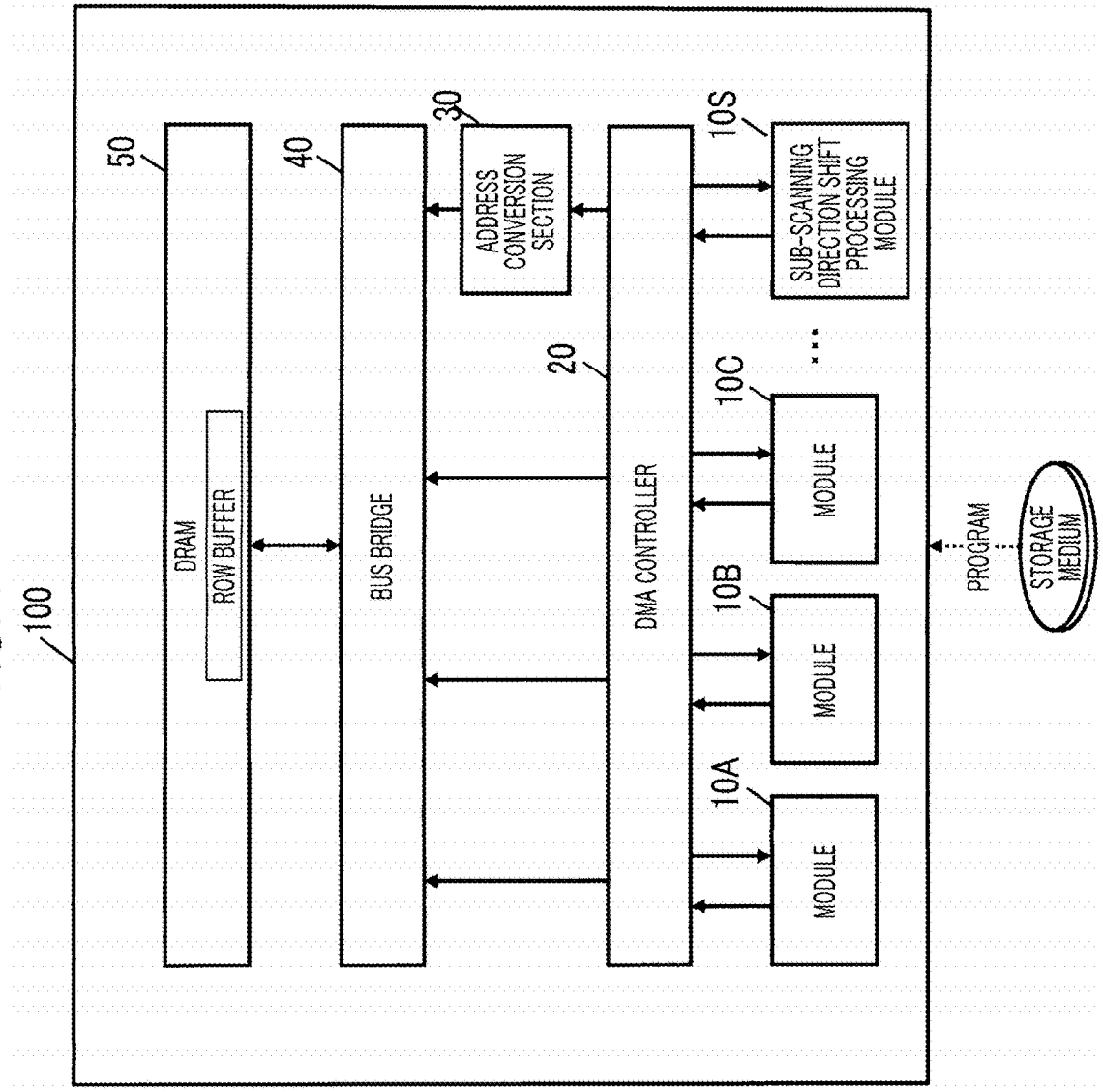

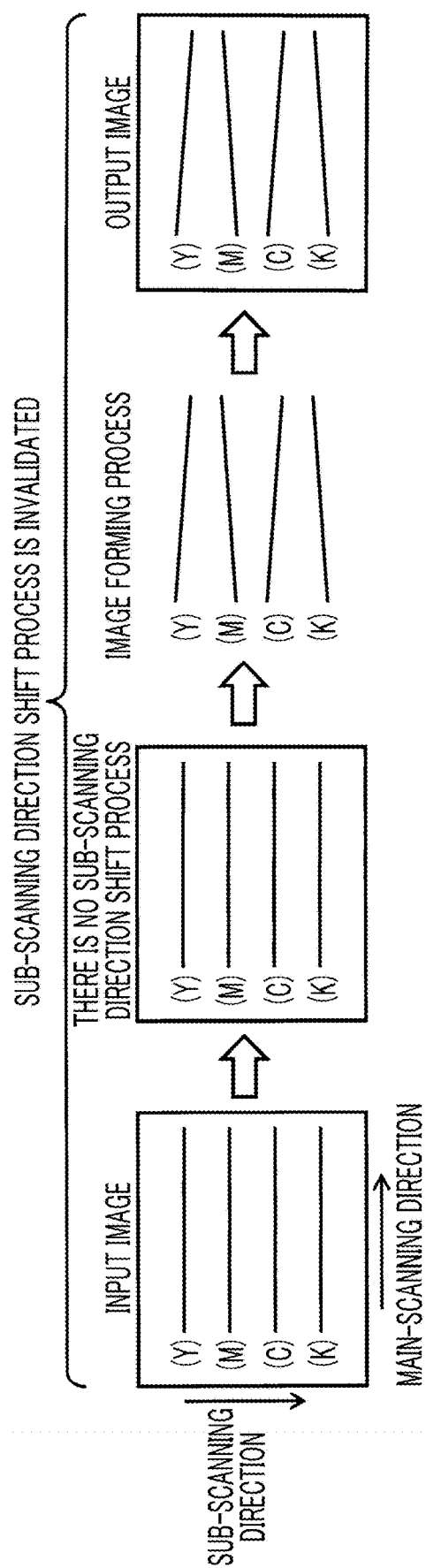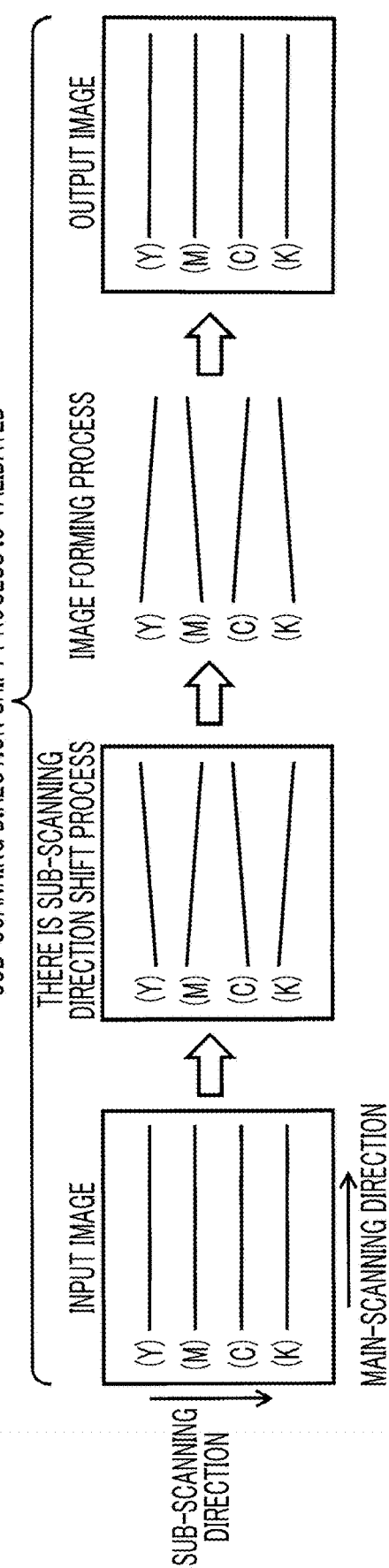

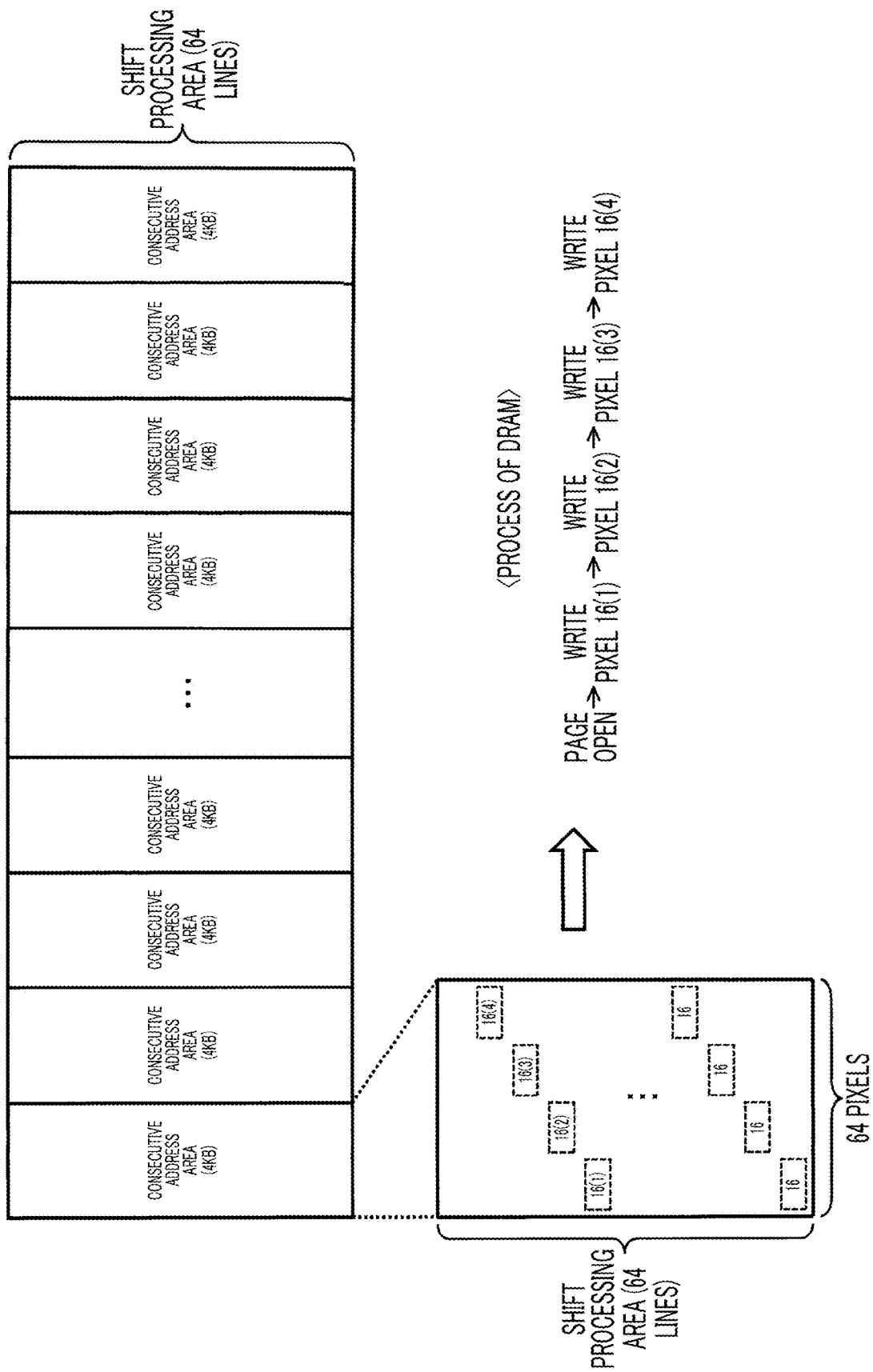

FIG. 5

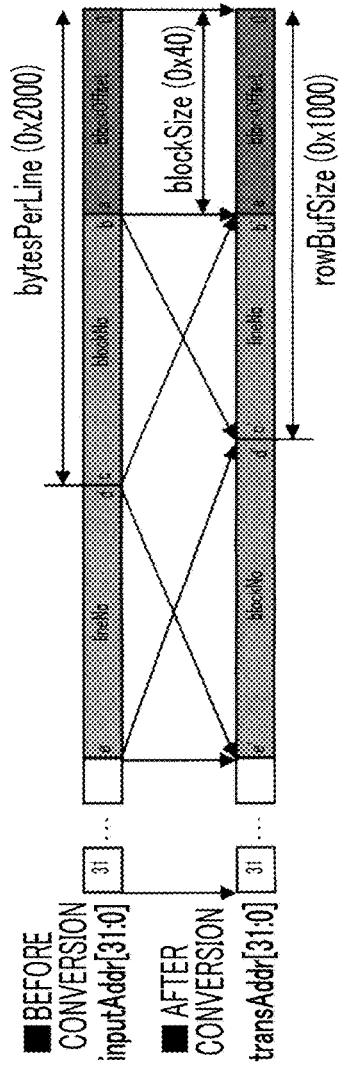

■ BEFORE CONVERSION
inputAddr = (lineNo * bytesPerLine) + (blockNo * blockSize) + blockOffset  (= 0x2030)
              0x1(Line)    0x2000Byte    0x0(Block)  0x40Byte    0x30Byte    (CASE OF PIXEL 16(4))

■ AFTER CONVERSION
transAddr = (transLineNo * rowBufSize) + (transblockNo * blockSize) + blockOffset
            0x1(Line)    0x1000Byte    0x1(Block)  0x40Byte    0x30Byte = (blockNo + rowBufSize) + (lineNo * blockSize) + blockOffset
   0x0(Line)    0x1000Byte    0x1(Block)  0x40Byte    0x30Byte = inputAddr[c.b] * rowBufSize + inputAddr[e.d] * blockSize + inputAddr[a.0]  (= 0x0070)
   0x0(Line)    0x1000Byte    0x4  0x40Byte    0x30Byte    (CASE OF PIXEL 16(4))

HERE
bytesPerLine = bytesPerPix * picNumPerLine (= 0x2000)
                    0x1Byte    0x2000 blockSize = bytesPerPix * transSizePerReq * reqBurstSize (= 0x40)
              0x1Byte    0x10    0x4

CONSTRAINT: lineNoMax(=transBlockNoMax) * blockSize ≤ rowBufSize (= 0x1000)
CONDITION <BIT FIELD>

■ BEFORE CONVERSION
inputAddr[31:0]  | 31 | ... |

■ AFTER CONVERSION
transAddr[31:0]  | 31 | ... |

<DEFINITION OF TERMS>

| | |
|---|---|
| inputAddr | : INPUT ADDRESS |
| lineNo | : LINE NUMBER OF ADDRESS TO BE CONVERTED |
| bytesPerLine | : NUMBER OF BYTES PER LINE |
| blockNo | : BLOCK NUMBER OF ADDRESS TO BE CONVERTED |
| blockSize | : SIZE OF ONE BLOCK |
| blockOffset | : WRITE DESTINATION offset WITHIN ONE BLOCK |
| bytesPerPix | : BIT DEPTH OF PIXEL |
| pixNumPerLine | : NUMBER OF PIXELS OF ONE LINE |
| transSizePerReq | : NUMBER OF CONSECUTIVE reads/writes PER DMA REQUEST |
| reqBurstSize | : NUMBER OF CONSECUTIVE ISSUANCES OF REQUESTS |
| rowBufSize | : SIZE OF row BUFFER OF DRAM |
| blockNoMax | : MAXIMUM VALUE OF BLOCK NUMBER |
| transBlockNoMax | : MAXIMUM VALUE OF BLOCK NUMBER AFTER CONVERSION |

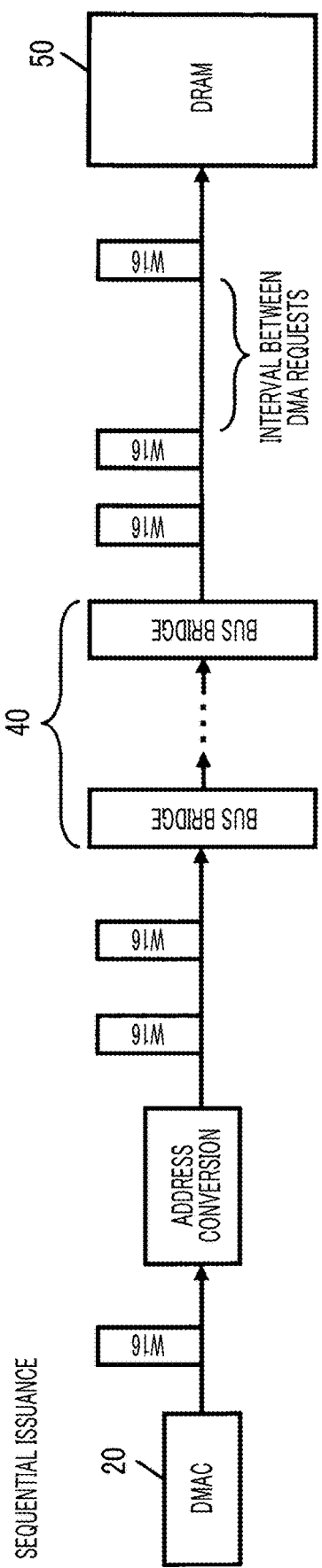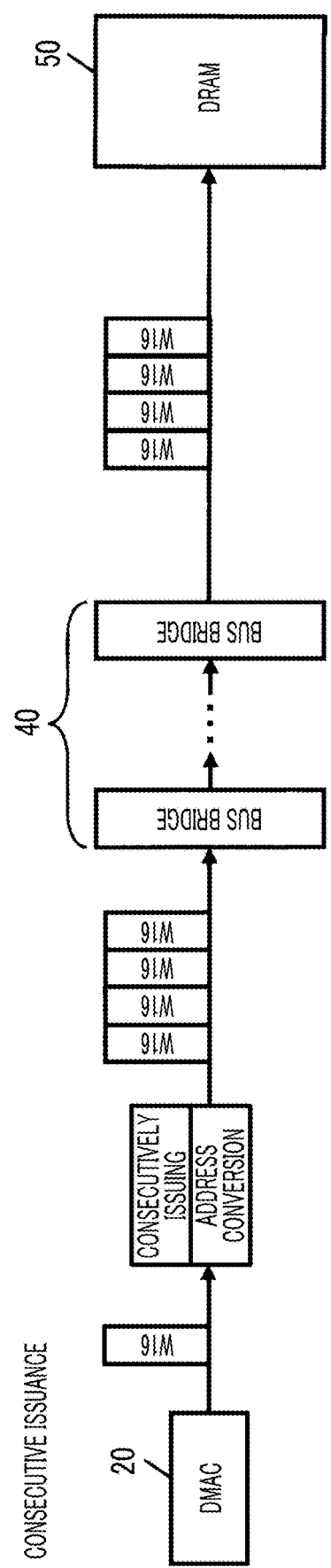

IMAGE PROCESSING APPARATUS AND NON-TRANSITORY COMPUTER READABLE MEDIUM STORING PROGRAM TO SUPPRESS DEVIATION IN SUB-SCANNING DIRECTION AT THE TIME OF IMAGE FORMATION

CROSS-REFERENCE TO RELATED APPLICATIONS

This application is based on and claims priority under 35 USC 119 from Japanese Patent Application No. 2018-042577 filed Mar. 9, 2018.

BACKGROUND

(i) Technical Field

The present invention relates to an image processing apparatus and a non-transitory computer readable medium storing a program.

(ii) Related Art

There is known a technique relating to a storage process of storing image data or the like to be processed by an image processing apparatus in a storage unit such as a memory.

For example, JP2000-029782A discloses a memory control device that converts a logical address group representing two segments including a predetermined number of consecutive identical column address groups on the same row addresses of two frame buffers into a real address group representing two consecutive segments on the same row address.

Further, JP2014-178745A discloses a memory control device which executes address mapping by allocating lower N bits of a burst transfer size, among main-scanning addresses, to lower bits of column addresses, and a predetermined number of bits following the higher side to the bank addresses, in allocation of main-scanning addresses indicating pixel positions in a main-scanning direction and sub-scanning addresses indicating pixel positions in a sub-scanning direction in an image to column addresses, row addresses, and bank addresses on an SDRAM, and reads or writes one line in the main-scanning direction by consecutively executing burst transfer plural times by multi-bank operation while changing the sub-scanning addresses at the break of the burst transfer.

Further, JP2012-168372A discloses an imaging forming apparatus which sets sub-scanning position information according to the profile of misregistration and constitutes an image correction process by processes of two stages, that is, a high-resolution correction process using a line buffer including a memory capable of high-speed random access and a low-resolution correction process using a memory that is easy to increase in capacity.

SUMMARY

In a case of performing a process of shifting plural pieces of pixel data so as to suppress deviation in the sub-scanning direction at the time of image formation, a process of writing data to a storage unit through a cache memory may be performed in some cases. In the process of writing pixel data to the cache memory, in a case where the storage destination address of each piece of pixel data, which is the unit of processing of a shift process, is apart by not less than the page size of the cache memory, after performing the process of writing pixel data of a unit of processing to the cache memory, it is necessary to perform extra processes such as sweeping out data from the cache memory before performing the process of writing the next pixel data of the same unit of processing. Aspects of non-limiting embodiments of the present disclosure relate to an image processing apparatus and a non-transitory computer readable medium storing a program, in which such extra processes are reduced.

Aspects of certain non-limiting embodiments of the present disclosure overcome the above disadvantages and other disadvantages not described above. However, aspects of the non-limiting embodiments are not required to overcome the disadvantages described above, and aspects of the non-limiting embodiments of the present disclosure may not overcome any of the problems described above.

According to an aspect of the present disclosure, there is provided an image processing apparatus including a processing unit that shifts a plurality of pieces of pixel data so as to suppress deviation in a sub-scanning direction at the time of image formation; a storage unit that stores the plurality of pieces of pixel data; and a converting unit that converts addresses of the plurality of pieces of pixel data such that a predetermined number of pieces of pixel data which are a unit of processing of the shift process are stored in a cache memory used by the storage unit at once.

BRIEF DESCRIPTION OF THE DRAWINGS

Exemplary embodiment(s) of the present invention will be described in detail based on the following figures, wherein:

FIG. 1 is a diagram illustrating an image processing apparatus which is an example of a specific exemplary embodiment of the present invention;

FIGS. 2A and 2B are diagrams illustrating a specific example of a sub-scanning direction shift process;

FIG. 4 is a diagram illustrating a specific example of a line buffer configuration of the sub-scanning direction shift process;

FIG. 5 is a diagram illustrating a specific example of address conversion by an address conversion section;

FIGS. 7A and 7B are diagrams for respectively explaining sequential issuance and consecutive issuance of access requests.

DETAILED DESCRIPTION

Figure 3:
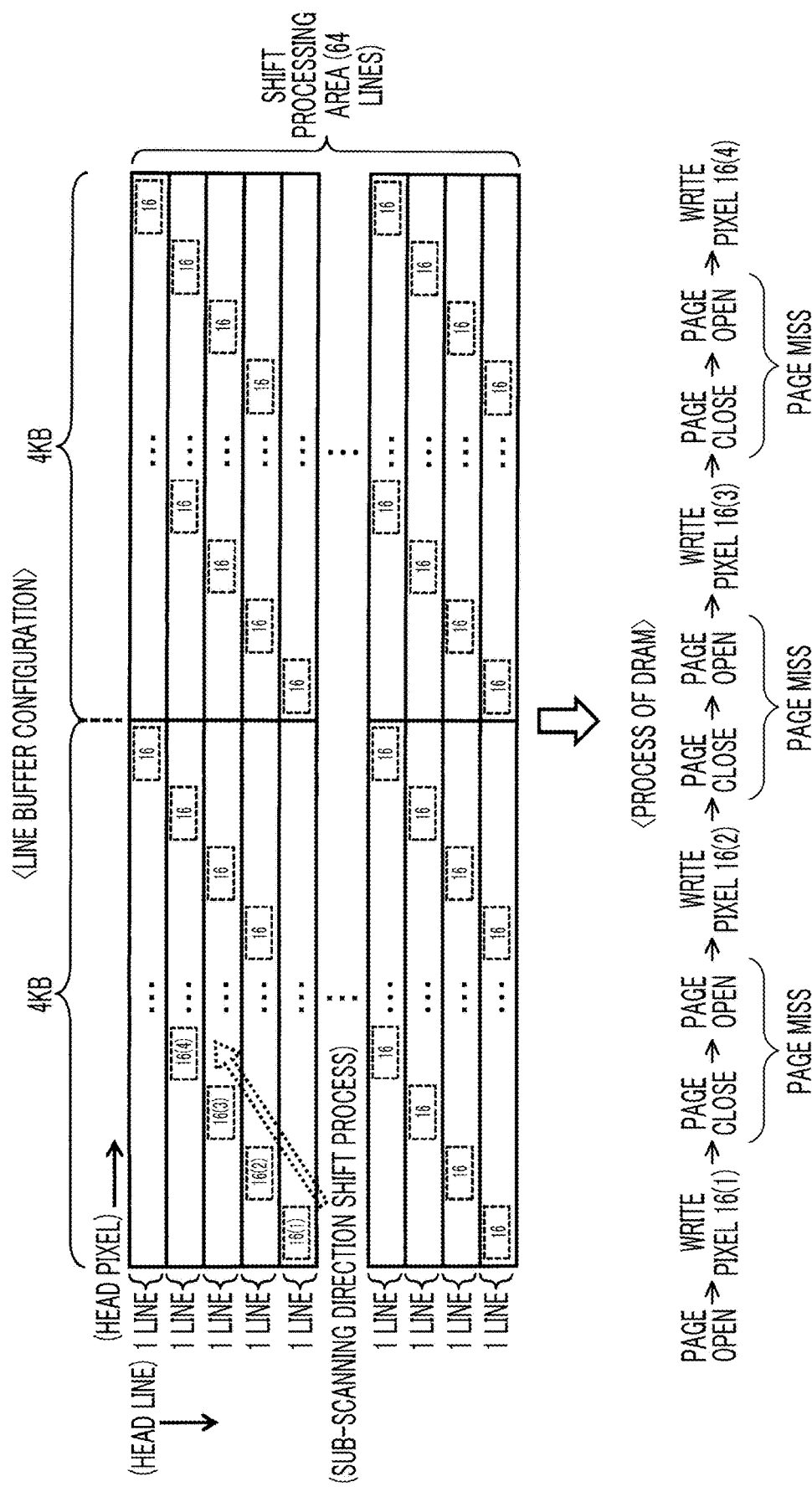
FIG. 3 is a diagram illustrating a line buffer configuration in which image data pieces are stored in order of arrangement.

FIG. 1 is a diagram illustrating an image processing apparatus 100 which is an example of a specific exemplary embodiment of the present invention. The image processing apparatus 100 executes an image process on image data (including image data relating to an image including only texts, numbers, and symbols). For example, image data obtained from an external device such as a computer or image data read by a scanner or the like is subjected to an image process by the image processing apparatus 100. The image data after the image process by the image processing apparatus 100 is formed into an image in an image forming process. An image corresponding to image data after the image process is printed on a medium such as paper by a printing process using, for example, a light emitting diode (LED).

The image processing apparatus 100 includes plural modules 10A to 10S, a DMA controller 20, an address conversion section 30, a bus bridge 40, and a dynamic random access memory (DRAM) 50. The plural modules 10A to 10S execute an image process on the image data. For example, an image process corresponding to each module is executed one after another in order of the module 10A, the module 10B, the module 10C, . . . .

Each module of the plural modules 10A to 10S includes a path to an image processing line buffer which is included in the DRAM 50. That is, writing data from each module (10A to 10S) to the DRAM 50 through the bus bridge 40 and reading data from the DRAM 50 to each module (10A to 10S) are performed by direct memory access (DMA) transfer controlled by the DMA controller 20.

Among the plural modules 10A to 10S, a sub-scanning direction shift processing module 10S is included. The sub-scanning direction shift processing module 10S performs a sub-scanning direction shift process on the image data. In the sub-scanning direction shift process, the addresses of the plural pieces of pixel data are converted by the address conversion section 30. The sub-scanning direction shift process and the address conversion will be described in detail later.

The plural modules 10A to 10S included in the image processing apparatus 100 of FIG. 1 are realized using hardware such as an image processing processor, for example.

Further, the image processing apparatus 100 of FIG. 1 may be realized by using a computer, for example. The computer has hardware resources of an arithmetic device such as a CPU, a storage device such as a memory or a hard disk, a communication device using a communication line such as the Internet, a device that reads data from a storage medium such as an optical disk or semiconductor memory and writes data, a display device such as a display, an operation device that receives an operation from a user, and the like.

Then, for example, a program (software) corresponding to a function of at least a part of the plural parts with reference numerals included in the image processing apparatus 100 illustrated in FIG. 1 is read into the computer, and at least a part of the functions of the image processing apparatus 100 is realized by a computer in cooperation between the hardware resources included in the computer are read software. For example, the program may be provided to a computer (image processing apparatus 100) through a communication line such as the Internet, or may be provided to a computer (image processing apparatus 100) by being stored in a storage medium such as an optical disk or a semiconductor memory.

The overall configuration of the image processing apparatus 100 illustrated in FIG. 1 is as described above. Next, the functions and the like realized by the image processing apparatus 100 in FIG. 1 will be described in detail. For the configuration components (portions) illustrated in FIG. 1, the reference numerals in FIG. 1 are used in the following description.

FIGS. 2A and 2B are diagrams illustrating a specific example of a sub-scanning direction shift process. In the specific example illustrated in FIGS. 2A and 2B, a two-dimensional output image formed on a medium such as paper is formed by an image forming process that is repeated while moving the image forming operation in the main-scanning direction (direction of each line) to the sub-scanning direction. In the case of a color image, image is formed by LED print heads corresponding to four color toners of yellow (Y), magenta (M), cyan (C), and black (K), for example. For example, one line of a color image is formed by a set of four lines corresponding to four colors (four toners) of YMCK.

However, in a case where an image is formed on a medium by, for example, an LED print head, the line deviates from an ideal main-scanning direction in terms of design owing to variations in the manufacture of the LED print head and the like, for example, a line inclined with respect to the main-scanning direction is formed. The sub-scanning direction shift process is executed in order to suppress deviation (inclination or the like) in the sub-scanning direction at the time of image formation.

FIG. 2A illustrates a specific example of image formation in which the sub-scanning direction shift process is invalidated. In a case where the image forming process is executed without performing the sub-scanning direction shift process on the input image, a line inclined with respect to the main-scanning direction is formed in the image forming process. As a result, for example, as a specific example illustrated in FIG. 2A, an output image in which lines corresponding to four colors (four toners) of Y, M, C, K are inclined is formed.

On the other hand, FIG. 2B illustrates a specific example of image formation in which the sub-scanning direction shift process is validated. In the sub-scanning direction shift process, the input image is shifted in a direction opposite to the deviation (inclination) generated in the image forming process. For example, for each color (each toner) of the four colors (four toners) of Y, M, C, K, the line of pixels constituting the input image is shifted in the sub-scanning direction (movement of the pixel position). Then, intentional deviation (inclination) caused by the sub-scanning direction shift process and deviation (inclination) occurring in the image forming process cancel each other out, so that a deviation in the sub-scanning direction is suppressed. Thus, for example, as a specific example illustrated in FIG. 2B, an output image in which the inclination of the line is suppressed (for example, there is no line inclination) is formed.

The sub-scanning direction shift processing module 10S executes the sub-scanning direction shift process by using an image processing line buffer which is included in the DRAM 50.

FIG. 3 is a diagram illustrating a specific example of a line buffer configuration in which image data pieces are stored in order of arrangement. The image data includes plural lines, and each line (one line) includes plural pieces of pixel data.

In the specific example illustrated in FIG. 3, plural pieces of pixel data are stored in the line buffer in the order of arrangement in the image data. Addresses are allocated in order from a head line, and addresses are allocated to respective pixel data in order from the head pixel for each line.

In the specific example illustrated in FIG. 3, the shift processing area configured with plural lines is a processing range (maximum number of lines in which line deviation (inclination) is suppressed) in the sub-scanning direction shift process, and for example, the shift processing area is appropriately set according to the magnitude of the deviation (inclination) generated in the image forming process, and the like. Although FIG. 3 illustrates a specific example in which the shift processing area (the maximum number of lines) is a fixed value of 64 lines, the range of the shift processing area may be other than 64 lines.

In the sub-scanning direction shift process, the input image is shifted in a direction opposite to the deviation (inclination) generated in the image forming process (see FIGS. 2A and 2B).

For example, in the course of the sub-scanning direction shift process, the line buffer configuration illustrated in FIG. 3 is obtained by writing an input image originally composed of straight lines parallel to the main-scanning direction into the line buffer space on the DRAM 50 while shifting the lines in the sub-scanning direction.

In the specific example illustrated in FIG. 3, each piece of pixel data 16 such as pixel data 16(1), pixel data 16(2), pixel data 16(3), and pixel data 16(4) indicates pixel data of 16 pixels (16 bytes). Each piece of pixel data 16 is a minimum correction unit in the sub-scanning direction shift process. Of course, the minimum correction unit may be configured with plural pixels other than 16 pixels, or the minimum correction unit may be one pixel.

In the process of writing data to the DRAM 50, data is temporarily stored in the row buffer, which is the cache memory of the DRAM 50, and the data is stored in the storage area of the DRAM 50 from the row buffer. High speed writing of data to the DRAM 50 is realized by the process through the row buffer.

However, the data storage size (page size) of the row buffer is smaller with respect to the capacity of the storage area of the DRAM 50. For example, in the specific example illustrated in FIG. 3 (FIG. 1), in a case where the data storage size (page size) of the row buffer is 4 kilobytes (KB), the size of data that may be stored in the row buffer at once is not more than 4 KB which is the page size. Therefore, in a case of writing data of which size is not less than the data storage size (page size) of the row buffer to the DRAM 50, it is necessary to repeat writing (page open) data to the row buffer and sweeping out (page close) data from the row buffer.

For example, in the specific example illustrated in FIG. 3, the pixel data 16(1), the pixel data 16(2), the pixel data 16(3), and the pixel data 16(4) are written across the lines.

However, in the specific example of FIG. 3, the addresses of the pixel data 16(1) and the pixel data 16(2) are apart by not less than 4 KB which is the page size (data storage size of the row buffer). Therefore, the pixel data 16(2) is not included in the 4 KB data of the consecutive addresses including the pixel data 16(1).

Therefore, it is impossible to process the pixel data 16(1) and the pixel data 16(2) by one page open (data writing into the row buffer) and one page close (sweeping out of data from the row buffer).

In addition, the addresses of the pixel data 16(2) and the pixel data 16(3), and the addresses of the pixel data 16(3) and the pixel data 16(4) are also separated by not less than 4 KB which is the page size (the data storage size of the row buffer). Therefore, it is impossible to process the pixel data 16(2) and the pixel data 16(3) by one page open and one page close, and it is impossible to process the pixel data 16(3) and the pixel data 16(4) by one page open and page close.

Therefore, in the specific example of the line buffer configuration illustrated in FIG. 3, a page miss (page close and page open) occurs every time of consecutive write requests of each pixel constituting a straight line parallel to the main-scanning direction corresponding to each piece of pixel data 16 from the pixel data 16(1) to the pixel data 16(4). As the number of occurrences of page misses increases, the bandwidth usage rate of the DRAM 50 deteriorates.

Therefore, the image processing apparatus 100 of FIG. 1 realizes a line buffer configuration in the sub-scanning direction shift process by changing the line buffer configuration of FIG. 3.

FIG. 4 is a diagram illustrating a specific example of a line buffer configuration in the sub-scanning direction shift process. FIG. 4 illustrates a changed line buffer configuration obtained by changing the line buffer configuration of FIG. 3.

In the specific example illustrated in FIG. 4, the line buffer configuration is changed such that each area of 64 pixels×64 lines becomes a consecutive area in which the address of the pixel data belonging to the area are consecutive (consecutive address area).

The size (data amount) of one consecutive address area is set to be not more than the data storage size (page size) of the row buffer which is the cache memory of the DRAM 50. In the specific example illustrated in FIG. 4, the size of one consecutive address area is 4 kilobytes (KB) which is the same as the data storage size of the row buffer.

Then, in the specific example illustrated in FIG. 4, four pieces of pixel data 16 including the pixel data 16(1), the pixel data 16(2), the pixel data 16(3), and the pixel data 16(4) which are units of processing of the sub-scanning direction shift process are collected in the same consecutive address area.

Therefore, according to the changed line buffer configuration illustrated in FIG. 4, a page miss (page close and page open) does not occur for four (four consecutive) write requests corresponding to four pieces of pixel data 16 from the pixel data 16(1) to the pixel data 16(4), which are a unit of processing of the sub-scanning direction shift process.

As described above, in the changed line buffer configuration illustrated in FIG. 4, since it is possible to store four pieces of pixel data 16 from the pixel data 16(1) to the pixel data 16(4) which are units of processing of the sub-scanning direction shift process into the row buffer by one page open, a page miss (see FIG. 3) does not occur. Therefore, compared with the case of the line buffer configuration illustrated in FIG. 3, according to the changed line buffer configuration illustrated in FIG. 4, the bandwidth usage rate of the DRAM 50 is improved.

In addition to the pixel data 16(1) to the pixel data 16(4), plural pieces of pixel data (four pieces of pixel data 16 in the specific example of FIG. 4), which are a unit of processing of the sub-scanning direction shift process, collected in the same consecutive address area. Thus, plural pieces of pixel data which are a unit of processing of the sub-scanning direction shift process are stored in the row buffer by one page open. That is, in the process of writing plural pieces of pixel data which are a unit of processing of the sub-scanning direction shift process into the DRAM 50, a process is realized in which storing data in the row buffer and sweeping out the data from the row buffer are not performed plural times.

In order to realize the change line buffer configuration illustrated in FIG. 4, the address conversion section 30 in FIG. 1 converts the address of the image data to be processed in the sub-scanning direction shift process. The address conversion section 30 converts addresses of plural pieces of pixel data constituting an input image (see FIGS. 2A and 2B), for example, before the sub-scanning direction shift process.

FIG. 5 is a diagram illustrating a specific example of address conversion by the address conversion section 30.

FIG. 5 illustrates a specific example of an address conversion expression for deriving a write destination address (transAddr) to the DRAM 50 after conversion, from a write destination address (inputAddr) to the DRAM 50 before conversion of each piece of pixel data. In addition, in FIG. 5, the bit fields of the address before conversion and the address after conversion is illustrated. The address conversion expression and definitions of the terms (parameters) included in the bit field illustrated in FIG. 5 are as follows.

"inputAddr" is a write destination address to the DRAM 50 before conversion of each piece of pixel data and is an input address to be input to the address conversion section 30. "lineNo" is the line number of the address to be converted and "bytesPerline" is the number of bytes per line. Further, "blockNo" is the block number of the address to be converted, "blockSize" is the size of each block (one block), and "blockOffset" is the write destination offset within each block.

"bytesPerPix" is the bit depth of the pixel (the number of bytes per pixel), and "pixNumPerLine" is the number of pixels of one line. "transSizePerReq" is the number of consecutive reads/writes per DMA request (one access request), which is the minimum correction unit in the sub-scanning direction shift process. "reqBurstSize" is the number of consecutive issuances of requests (access requests).

Then, "rowBufSize" is the size of the row buffer of the DRAM 50, "blockNoMax" is the maximum value of the block number, and "transBlockNoMax" is the maximum value of the block number after conversion.

In the specific example illustrated in FIG. 5, it is possible to change the value of the parameter included in the address conversion expression, based on the constraint condition that the product of the maximum number of lines "lineNoMax (=transBlockNoMax)" in the sub-scanning direction shift process and the size of each block "blockSize" is not more than the row buffer size "rowBufSize" of the DRAM 50.

Figure 6:
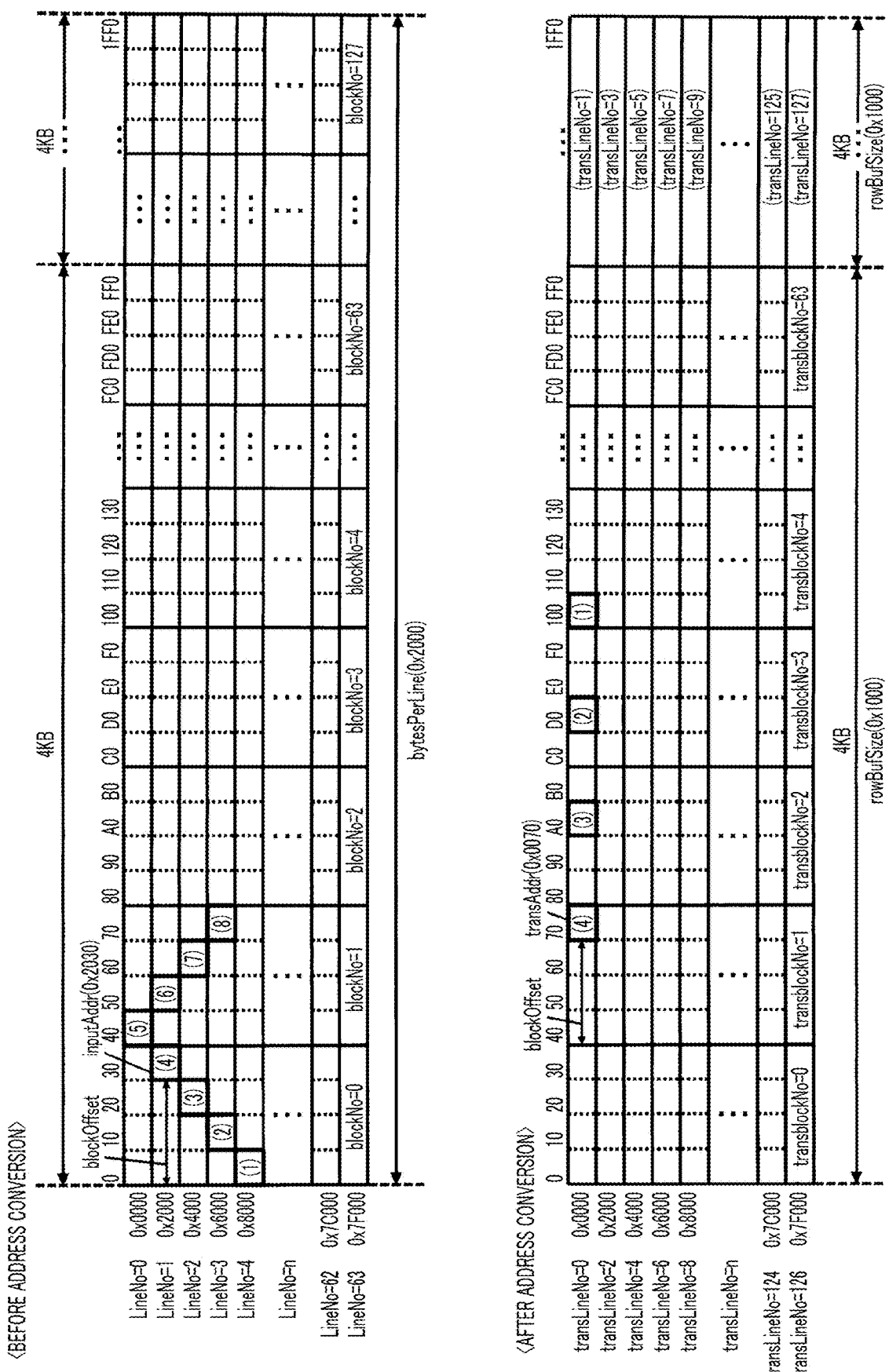
FIG. 6 is a diagram illustrating specific examples of line buffer configurations before and after address conversion.

FIG. 6 is a diagram illustrating specific examples of line buffer configurations before and after address conversion. FIG. 6 illustrates a line buffer configuration before address conversion and a line buffer configuration after address conversion according to the specific example of address conversion illustrated in FIG. 5.

In the specific example illustrated in FIG. 6, the pixel data 16(1) to 16(4) are plural pieces of pixel data which are a unit of processing of the sub-scanning direction shift process, and correspond to the pixel data 16(1), the pixel data 16(2), the pixel data 16(3), and the pixel data 16(4) in FIG. 3.

In a case where the address conversion illustrated in FIG. 5 is applied to each piece of pixel data constituting the line buffer before address conversion illustrated in FIG. 6, the line buffer configuration after address conversion illustrated in FIG. 6 is obtained.

In the line buffer configuration after address conversion illustrated in FIG. 6, the pixel data 16(1) to (4) are collected in a 4 KB consecutive address area corresponding to the line number 0 after conversion (transLineNo=0).

In the specific example illustrated in FIG. 6, the collection (64 pixels=64 bytes) of four pieces of pixel data 16 arranged in the line direction (horizontal direction in FIG. 6) constitutes one block (block size 64 bytes). For example, in the line buffer configuration before address conversion, plural blocks of blockNo=0, blockNo=1, blockNo=2, . . . are configured in order from the head address side of each line. Further, also in the line buffer configuration after address conversion, plural blocks of transBlockNo=0, transBloc-kNo=1, transBlockNo=2, . . . are configured in order from the head address side of each line.

In the specific example illustrated in FIG. 6, in addition to the pixel data 16(1) to (4), plural pieces of pixel data which are a unit of processing of the sub-scanning direction shift process are collected in the same consecutive address area. For example, pixel data 16(5) to (8) are plural pieces of pixel data which are a unit of processing of the sub-scanning direction shift process. In a case where the address conversion illustrated in FIG. 5 is applied, the pixel data 16(5) to (8) are collected in a 4 KB consecutive address area corresponding to the converted line number 1 (transLineNo=1), in the line buffer configuration after address conversion illustrated in FIG. 6.

In this manner, according to the specific example of the address conversion illustrated in FIG. 5, for example, a specific example of the line buffer configurations before and after the address conversion illustrated in FIG. 6 are realized. That is, plural pieces of pixel data are rearranged by address conversion on plural pieces of pixel data from the line buffer configuration before address conversion by plural pieces of pixel data arranged in a matrix, and the line buffer configuration after address conversion is realized.

Further, in a case of issuing an access request of pixel data, the image processing apparatus 100 in FIG. 1 collects and consecutively issues plural access requests corresponding to plural pieces of pixel data which are a unit of processing of the sub-scanning direction shift process. Before explaining a specific example of consecutive issuance, sequential issuance and consecutive issuance of access requests will be described.

FIGS. 7A and 7B are diagrams for respectively explaining sequential issuance and consecutive issuance of access requests. FIG. 7A illustrates a specific example of sequentially issuing DMA requests (access requests) one by one. In the specific example illustrated in FIG. 7A, for example, the DMA controller 20 sequentially issues write requests (W16) of the pixel data 16 one by one according to the processing speed of the image forming process (printing process), the address of the pixel data of 16 requested for writing is converted, and then the pixel data 16 is sequentially written to the DRAM 50 through the bus bridge 40.

In the specific example illustrated in FIG. 7A, for example, in a case where the interval between the DMA requests (W16) is empty in the sub-scanning direction shift process, the controller of the DRAM 50 may insert page open (write data to the row buffer) and page close (sweep out data from the row buffer), for a transaction process other than the sub-scanning direction shift process.

Therefore, in issuing access requests to the consecutive address space of the DRAM 50, which may be stored at once in the row buffer which is the cache memory of the DRAM 50, the image processing apparatus 100 (FIG. 1) collects and consecutively issues plural access requests corresponding to plural pieces of pixel data which are a unit of processing of the sub-scanning direction shift process.

FIG. 7B illustrates a specific example of consecutively issuing DMA requests (access requests). In the specific example illustrated in FIG. 7B, plural (four in the specific example of FIGS. 7A and 7B) write requests (W16) of the pixel data 16 issued from the DMA controller 20 are collected, the addresses of the plural pieces of pixel data 16 corresponding to the plural write requests are converted, and then the plural write requests are consecutively written into the DRAM 50 through the bus bridge 40.

In the specific example illustrated in FIG. 7B, for example, the interval between plural (four in the specific example of FIGS. 7A and 7B) DMA requests (W16) collected in the sub-scanning direction shift process is not empty. Therefore, page open and page close by the transaction process other than the sub-scanning direction shift process are not inserted.

In addition, the number of consecutive issuance of access requests in the sub-scanning direction shift process is set so as to satisfy the constraint conditions illustrated in FIG. 5, for example. For example, in the specific example illustrated in FIG. 5, the block size "blockSize" is determined, by the number of bytes per pixel "bytesPerPix", "transSizePerReq" which is the minimum correction unit in the sub-scanning direction shift process, and the number of consecutive issuance of access requests "reqBurstSize" Then, the number of consecutive issuance of access requests "reqBurstSize" is set so as to satisfy the constraint condition that the data size (the left side of the constraint condition) determined by the maximum number of lines "lineNoMax (=transBlockNoMax)" in the sub-scanning direction shift process and the block size "blockSize" is not more than the row buffer size "rowBufSize" (the right side of the constraint condition) of the DRAM 50.

For example, in a case where the number of bytes per pixel "bytesPerPix" is one byte, "transSizePerReq" which is the minimum correction unit in the sub-scanning direction shift process is 16 pixels, the maximum number of lines "lineNoMax" in the sub-scanning direction shift process is 64 lines, and the row buffer size "rowBufSize" of the DRAM 50 is 4 KB, the number of consecutive issuance "reqBurstSize" of the access requests is set to 4 or less.

Figure 8:
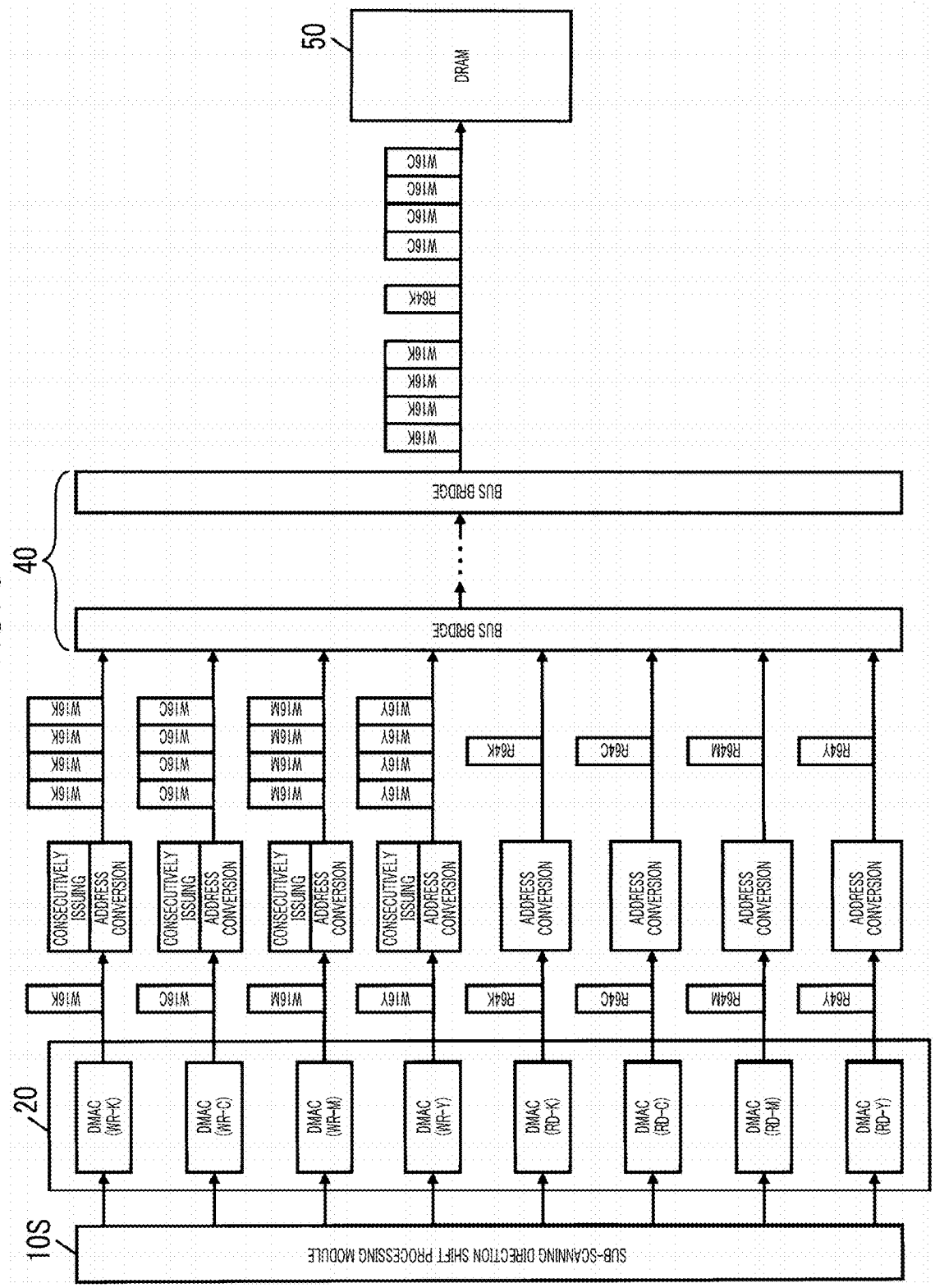
FIG. 8 is a diagram illustrating a specific example of consecutive access requests by the image processing apparatus of FIG. 1.

FIG. 8 is a diagram illustrating a specific example of consecutive access requests by the image processing apparatus 100 of FIG. 1. In the specific example illustrated in FIG. 8, the sub-scanning direction shift processing module 10S performs the sub-scanning direction shift process for each color (each toner) of yellow (Y), magenta (M), cyan (C), and black (K).

Further, the DMA controller 20 in the specific example illustrated in FIG. 8 issues a DMA request (write request) relating to the pixel data 16 (16 pixels which are a minimum correction unit) for each color of YMCK in the sub-scanning direction shift process. For example, the DMAC (WR-K) issues a write request (W16K) relating to the pixel data 16 of black (K), the DMAC (WR-C) issues a write request (W16C) relating to the pixel data 16 of cyan (C), the DMAC (WR-M) issues a write request (W16M) relating to the pixel data 16 of magenta (M), and the DMAC (WR-Y) issues a write request (W16Y) relating to the pixel data 16 of yellow (Y).

In the specific example illustrated in FIG. 8, in the sub-scanning direction shift process corresponding to each color of Y, M, C, K, consecutive access requests are executed in which plural access requests corresponding to each color are collected. That is, for each color, plural write requests corresponding to plural pieces of pixel data which are a unit of processing of the sub-scanning direction shift process are collected and consecutively issued.

For example, plural (four in the specific example of FIG. 8) write requests (W16K) relating to the pixel data 16 of black (K) issued from the DMAC (WR-K) of the DMA controller 20 are collected, the addresses of the plural pieces of pixel data corresponding to the plural write requests (W16K) are converted, and then the plural write requests are consecutively written into the DRAM 50 through the bus bridge 40.

For example, plural (four in the specific example of FIG. 8) write requests (W16C) relating to the pixel data 16 of cyan (C) issued from the DMAC (WR-C) of the DMA controller 20 are collected, the addresses of the plural pieces of pixel data corresponding to the plural write requests (W16C) are converted, and then the plural write requests are consecutively written into the DRAM 50 through the bus bridge 40.

Similarly, plural write requests (W16M) relating to the pixel data 16 of magenta (M) issued from the DMAC (WR-M) of the DMA controller 20 are collected, and plural write requests (W16Y) relating to the pixel data 16 of yellow (Y) issued from the DMAC (WR-Y) of the DMA controller 20 are collected.

As described above, in the specific example illustrated in FIG. 8, in the sub-scanning direction shift process corresponding to each color of Y, M, C, K, consecutive access requests (write requests) are executed in which plural access requests (write requests) corresponding to each color are collected. Therefore, in the consecutive access requests (write requests) corresponding to each color, page open and page close by the transaction process other than the sub-scanning direction shift process corresponding to the color is not inserted.

In addition, the DMA controller 20 may collect plural access requests (write requests) and then issue consecutive access requests (write requests), before address conversion by the address conversion section 30. In addition, the address conversion section 30 may execute a process for collecting plural access requests (write requests) and address conversion. In addition, a processing section may be provided that collects plural access requests (write requests) after address conversion by the address conversion section 30.

Further, the DMA controller 20 illustrated in FIG. 8 issues a read request for each color of YMCK in the sub-scanning direction shift process. In the read request, since plural pieces of pixel data to be read are already stored in the DRAM 50, a batch read request is issued for all the pixel data (in the specific example of FIG. 8, 16 pixels×4=pixel data 64 of 64 pixels) which are the unit of processing of the sub-scanning direction shift process.

For example, the DMAC (RD-K) issues a read request (R64K) for the pixel data 64 of black (K), the DMAC (RD-C) issues a read request (R64C) for the pixel data 64 of cyan (C), the DMAC (RD-M) issues a read request (R64M) for the pixel data 64 of magenta (M), and the DMAC (RD-Y) issues a read request (R64Y) for the pixel data 64 of yellow (Y).

The exemplary embodiments of the present invention have been described above, but the described exemplary embodiments are merely illustrative in all respects and are not intended to limit the scope of the invention. The present invention encompasses various modification examples without departing from the gist thereof.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An image processing apparatus comprising:
a memory; and
a processor, configured to:
shift a plurality of pieces of pixel data so as to suppress deviation in a sub-scanning direction at a time of image formation;
store the plurality of pieces of pixel data in the memory; and
convert addresses of the plurality of pieces of pixel data such that a predetermined number of pieces of pixel data which are a unit of processing of a shift process are stored in a cache memory used by the memory at once,
wherein in a case of issuing a write request of pixel data to be stored in the cache memory, a plurality of access requests corresponding to the predetermined number of pieces of pixel data are collected and issued consecutively,
wherein a block size is determined by a number of bytes per pixel, a minimum correction unit for the shift process, and a number of consecutive issuances of the plurality of access requests which are consecutively issued, and
wherein the number of consecutive issuances is set to satisfy a constraint condition that a data size determined by a maximum number of lines which is a processing range of the shift process and the block size is not more than a data storage size of the cache memory.

2. The image processing apparatus according to claim 1, wherein in a process of writing the predetermined number of pieces of pixel data to the memory, storing data in the cache memory and sweeping out the data from the cache memory are not performed a plurality of times.

3. The image processing apparatus according to claim 1, wherein the processor converts addresses of the plurality of pieces of pixel data such that the predetermined number of pieces of pixel data are included in a data string of consecutive addresses with a size which is not more than a data storage size of the cache memory.

4. The image processing apparatus according to claim 2, wherein the processor converts addresses of the plurality of pieces of pixel data such that the predetermined number of pieces of pixel data are included in a data string of consecutive addresses with a size which is not more than a data storage size of the cache memory.

5. The image processing apparatus according to claim 3, wherein the processor executes a process of rearranging the plurality of pieces of pixel data by converting addresses of the plurality of pieces of pixel data which are arranged in a matrix.

6. The image processing apparatus according to claim 4, wherein the processor executes a process of rearranging the plurality of pieces of pixel data by converting addresses of the plurality of pieces of pixel data which are arranged in a matrix.

7. A non-transitory computer readable medium storing a program causing a processor of a computer to:
shift a plurality of pieces of pixel data so as to suppress deviation in a sub-scanning direction at a time of image formation; and
convert addresses of the plurality of pieces of pixel data such that a predetermined number of pieces of pixel data which is a unit of processing of a shift process is stored in a cache memory of a memory at once,
wherein in a case of issuing a write request of pixel data to be stored in the cache memory, a plurality of access requests corresponding to the predetermined number of pieces of pixel data are collected and issued consecutively,
wherein a block size is determined by a number of bytes per pixel, a minimum correction unit for the shift process, and a number of consecutive issuances of the plurality of access requests which are consecutively issued, and
wherein the number of consecutive issuances is set to satisfy a constraint condition that a data size determined by a maximum number of lines which is a processing range of the shift process and the block size is not more than a data storage size of the cache memory.

8. An image processing apparatus comprising:
processing means for shifting a plurality of pieces of pixel data so as to suppress deviation in a sub-scanning direction at a time of image formation;
storage means for storing the plurality of pieces of pixel data; and
converting means for converting addresses of the plurality of pieces of pixel data such that a predetermined number of pieces of pixel data which are a unit of processing of a shift process are stored in a cache memory used by the storage means at once,
wherein in a case of issuing a write request of pixel data to be stored in the cache memory, a plurality of access requests corresponding to the predetermined number of pieces of pixel data are collected and issued consecutively,
wherein a block size is determined by a number of bytes per pixel, a minimum correction unit for the shift process, and a number of consecutive issuances of the plurality of access requests which are consecutively issued, and
wherein the number of consecutive issuances is set to satisfy a constraint condition that a data size determined by a maximum number of lines which is a processing range of the shift process and the block size is not more than a data storage size of the cache memory.

* * * * *